United States Patent [19]
Harper

[11] 3,966,474
[45] June 29, 1976

[54] METHOD FOR IMPROVING ADHERENCE OF PHOSPHOR-PHOTOBINDER LAYER DURING LUMINESCENT-SCREEN MAKING

[75] Inventor: Stanley Arthur Harper, New Providence, Pa.

[73] Assignee: RCA Corporation, New York, N.Y.

[22] Filed: Nov. 25, 1974

[21] Appl. No.: 527,055

[52] U.S. Cl................................... 96/36.1; 427/68
[51] Int. Cl.².......................................... G03C 5/00
[58] Field of Search............... 117/33.5 C, 33.5 CM, 117/33.5 CP; 313/92 CS, 92 B, 92 PD; 96/36.1, 67; 427/68

[56] References Cited
UNITED STATES PATENTS

| 2,785,331 | 3/1957 | Donahue | 427/68 |
| 3,275,466 | 9/1966 | Kell | 427/68 |
| 3,440,077 | 4/1969 | Dapolito et al. | 427/68 |
| 3,481,733 | 12/1969 | Evans | 96/36.1 |
| 3,483,010 | 12/1969 | Glovatsky | 427/68 |
| 3,582,389 | 6/1971 | Saulnier | 117/33.5 CM |
| 3,623,867 | 11/1971 | Saulnier et al. | 117/33.5 C |
| 3,661,580 | 5/1972 | Mayaud | 96/36.1 |
| 3,703,401 | 11/1972 | Deal et al. | 117/33.5 CP |

Primary Examiner—Edward C. Kimlin
Attorney, Agent, or Firm—G. H. Bruestle; L. Greenspan

[57] ABSTRACT

The inner surface of a faceplate panel of a cathode-ray tube is cleaned and then precoated with water-insoluble, organic, polymeric particles, the precoating having a weight of 0.08 to 0.80 and preferably 0.20 to 0.40 mg/cm². A subsequently applied phosphor-photobinder coating is exposed to a light image and then developed with a turbulent quantity of aqueous liquid. The phosphor-photobinder coating exhibits improved adherence during the developing step due to the presence of the precoating.

10 Claims, 3 Drawing Figures

METHOD FOR IMPROVING ADHERENCE OF PHOSPHOR-PHOTOBINDER LAYER DURING LUMINESCENT-SCREEN MAKING

BACKGROUND OF THE INVENTION

This invention relates to a method for producing a luminescent screen, as for a cathode-ray tube, which screen exhibits markedly improved adherence to its support during the processing thereof.

In preparing a luminescent screen by the slurry-direct photographic process, as described, for example, in U.S. Pat. No. 3,406,068 to H. B. Law, a glass support is coated with an aqueous slurry comprising a photosensitizable binder (photobinder), a photosensitizer therefor, and particles of phosphor material. Then the coating is dried and then exposed to a light pattern, as by exposure through an apertured mask, to produce regions of greater and regions of lesser solubility in the coating. The coating is then developed through removing the coating regions of greater solubility as by spraying and/or flushing the coating with water or aqueous solutions under pressure. The adherence of the retained less-soluble regions of the coating to the glass surface is important and particularly critical during the development step. The loss of even a small part of the less-soluble regions, which should constitute portions of the screen, requires the screen to be scrapped.

It is known that the adherence of the coating to a clean glass surface can be improved by applying to the glass surface a very thin precoating of a water-soluble polymeric material prior to applying the coating. See, for example, Canadian patent No. 602,838 and U.S. Pat. No. 3,481,733. In a typical process, the surface of a glass panel is washed with an aqueous ammonium bifluoride composition, rinsed with deionized water, then rinsed with a dilute solution of polyvinyl alcohol of about 0.2 to 0.5 weight percent concentration and then dried. It is theorized that a very thin, perhaps monomolecular, precoating of polyvinyl alcohol remains on the glass surface, which precoating improves the adherence of a subsequently applied phosphor coating comprising a dichromate-sensitized polyvinyl alcohol and phosphor particles and having a weight of about 1 to 3 mg phosphor/cm$^2$. It is not apparent why such a thin precoating improves the adherence of the subsequently applied phosphor coating. However, the improvement is important and the precoating is widely used in the manufacture of screens for color television picture tubes.

When heavier screen weights in the range of 4 to 6 milligrams phosphor per square centimeter (mg/cm$^2$) are desired, further improvements in adherence are required. Polyvinyl-alcohol precoatings in any weight are ineffective for this purpose. However, an improvement in adhering heavier phosphor coatings can be achieved by employing a heavy precoating of light-exposed dichromate-sensitized polyvinyl alcohol or other photosensitive organic colloid with or without phosphor particles present. Such technique, however, requires the application of a photosensitive material and the subsequent controlled light exposure of the precoating and development to provide the required uniform improvement in adherence which is required. Besides the extra processing steps, this procedure is undesirable in color television picture tubes because some dichromate photosensitizer remains in the precoating and eventually leaves a residue which optically absorbs some of the luminescence from the screen. The novel method employs a thick adherent precoating which is adequate for adhering thicker phosphor layers but which is not photosensitive, does not require exposure to light, and does not leave a light-absorbing residue.

SUMMARY OF THE INVENTION

The novel method comprises adhering to a clean glass surface a precoating comprising water-insoluble, organic, polymeric particles, the precoating having a weight of about 0.08 to 0.80 mg/cm$^2$ and preferably about 0.20 to 0.40 mg/cm$^2$. Such precoating is preferably produced by applying to the glass surface and then drying an aqueous emulsion comprising 5 to 15 weight percent of the water-insoluble polymeric material. The water-insoluble polymeric material is one which is rendered nondispersible in water when dried at room temperature or at moderate temperatures of about 55°C. It must be volatilized when baked in air at about 400°C. The preferred polymeric material consists essentially of polystyrene particles of about 0.10 to 0.35 micron average diameter. After the precoating has been applied, a phosphor-photobinder coating is deposited on the precoating and the coating is exposed, and developed by the slurry direct-photographic process as in the prior art.

By employing the novel precoating step according to the invention, heavier and thicker phosphor coatings can be applied, exposed and developed without loss of any parts of the screen during the development. Phosphor screen weights of 4 to 6 mg/cm$^2$ can be successfully fabricated with normal processing steps. No additional processing steps are required, and the precoatng does not leave a light-absorbing residue.

DETAILED DESCRIPTION OF THE PREFERRED EMBODIMENTS

Figure 1:
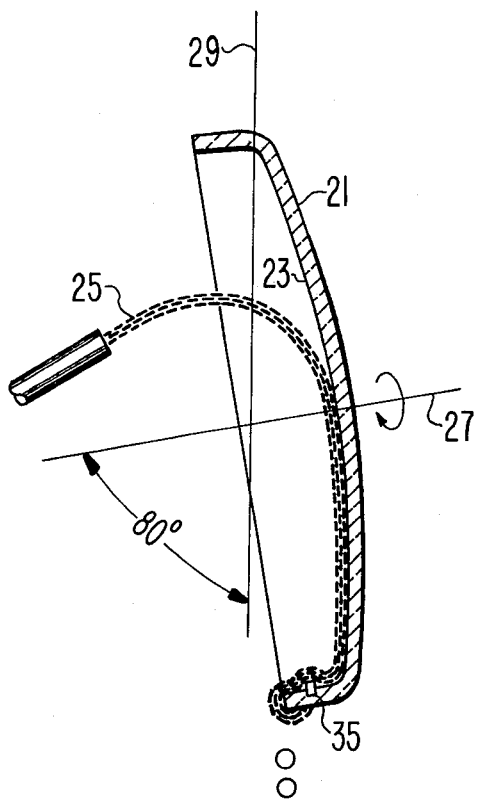
FIG. 1 is a sectional elevated view of a faceplate panel during the step of precoating the panel by the novel method.

Many emulsions of water-insoluble organic polymeric materials when applied as a relatively heavy precoating will substantially increase the adherence during water development of a subsequently-applied and light-exposed phosphor-photobinder coating. These precoatings are applied to the bare glass surface as simple layers and then dried. The precoatings do not require photosensitization and exposure and development, such as is required in some prior-art methods. A variety of water-insoluble organic materials will produce increased adherence when used in simple heavy precoatings. This has led to the theory that a precoating which performs as a graded, or flexible, seal between the phosphor-photobinder coating and the glass surface, can improve the adherence of the coating. This theory can be explained by considering the mechanism of adherence failure described below.

The usual phosphor-photobinder coating is dry and relatively rigid when it is exposed to actinic light to insolubilize the desired pattern in the coating. When developing water or aqueous solution is sprayed on the exposed coating, the coating immediately soaks up water, swells rapidly and expands significantly. Because the glass support is rigid, severe stresses arise between the coating and the glass surface, resulting in weakened adhesion bonds between the coating and the glass surface. The unexposed portions of the phosphor-photobinder layer disintegrate and are flushed away by the developing water leaving, for example, islands of exposed phosphor-photobinder coating called "dots" on the surface. Near the end of the developing step, which may be of 15 to 45 seconds duration, the dots are highly saturated and swelled with water, their adhesion bonds having been weakened by the rapid expansion; thus the force of the developing spray frequently dislodges the dots from the surface. By providing the novel precoating so that it functions as a graded, or flexible, seal between the rapidly expanding coating and the rigid glass surface, the adherence of the dots to the glass surface is improved.

Precoatings found to increase the adherence of the coating to the glas surface are latex emulsions or emulsions of polymers which are deposited as particles (not as smooth continuous films). Such particulate precoatings are believed to soak up developing water and partially expand with the phosphor-photobinder coating, thereby reducing the stresses between the coating and the glass surface.

An especially effective group of emulsions for precoating color television picture tube panels was found to be composed mostly of particles of water-insoluble polystyrene polymers. A commercially-available family of such materials, sold by Morton Chemical Company, New York, N.Y., under the trade name "Opacifiers" has been found suitable. The commercial materials are described as constituted mostly of polystyrene or copolymers of styrene with styrene-type monomers. In addition, these materials may be copolymerized with small proportions of acrylic acid and/or methacrylic acid. The average particle size in these emulsions is in the range of 0.10 to 0.35 micron average diameter. It is believed that precoatings prepared from these materials do not form continuous films, and therefore the precoatings can absorb developing water very rapidly and expand during the developing step for the exposed coating. Any finely-divided water-insoluble polymeric material which forms a porous layer and is not strongly hydrophobic may be expected to provide increased coating adherence when used as a thick adherent precoating in the novel method.

Only small improvements in coating adherence were found when the precoating weight was light, such as less than 0.08 mg/cm$^2$ (which is extremely heavy as compared with the usual monomolecular precoating weight). By the novel method, the coating adherence generally is optimum with precoating weights of 0.20 to 0.40 mg/cm$^2$. Generally, precoating weights up to 0.80 mg/cm$^2$ may be used. However, precoating weights greater than 0.50 mg/cm$^2$ do not provide additional coating adherence and merely increase the material cost. The optimum thickness or weight of any particular precoating will depend in part on the flexibility, porosity, discontinuity, etc. of the precoating itself.

Useful precoatings must have other desirable characteristics. The precoating when dried must be relatively insoluble and nondispersible in the developing water. In addition, it should be adherent to the glass surface. However, because the precoating is spread over a large area of the surface, a moderate precoating adherence strength is adequate to hold the precoating to the glass surface during water development of the coating in subsequent process steps. If necessary or desirable, additives may be used to improve the adherence of the precoating to the glass surface.

Precoatings which are exceptionally effective in improving coating adherence may have the adverse characteristic of poor cleanup of the phosphor material after coating development. By "poor cleanup" is meant that scattered particles of phosphor adhere to the unexposed areas of the precoating instead of being flushed away completely during the developing step. The cleanup of the polystyrene polymeric materials can be improved by adding specific acrylic emulsions to the precoating composition. These acrylics by themselves form hard films and are poor as precoating materials. For example, a mixed emulsion may have 10 percent polystyrene particles and 2 per cent acrylic particles to improve the cleanup characteristics of the precoating made from the emulsion. The viscosity of the precoating composition may be modified, if necessary, to improve flow characteristics and to provide a smoother precoating. Viscosity builders, such as viscous acrylic emulsions, have been found to be useful additives for this purpose.

It has also been observed that cathode-ray-tube screens produced by the novel method exhibit 2 to 10 percent more brightness than screens produced by methods using the polyvinyl alcohol precoating. The reason for this effect is not completely understood.

A typical precoatng emulsion composition which has been found to be effective contains 10 weight percent polystyrene emulsion (0.1 to 0.4 micron particle size), 1 weight percent acrylic emulsion (hard, film-forming acrylic to improve phosphor cleanup), 0.1 per cent viscous polyacrylate emulsion (thickening agent to improve flow characteristics), and water. A specific example of a preferred precoating composition and practice of the novel method is as follows.

EXAMPLE

Prepare a precoating composition of the following formulation in weight percent of solids:

| | |
|---|---|
| Polystyrene copolymer emulsion such as Opacifier E-305 (Morton Chemical Co.) | 8.00 percent |
| Acrylic copolymer emulsion, such as Rhoplex AC-73 (Rohm and Haas) | 1.80 percent |
| Polyacrylate thickening agent such as Acrysol G-110 (Rohm and Haas) | 0.08 percent |
| Dispersing agent, such as Pluronic L-92 (Wyandotte Chemical Co.) | 0.01 percent |
| Water | 90.11 percent |

In preparing the precoating composition, the appropriate quantities of the commercially-available components are weighed (they may be first diluted with water for convenience) and added one at a time while slowly stirring the emulsion. Before use, the emulsion mixture is strained to remove very large aggregates or extraneous dirt. Instead of the Acrysol G-110 (which is an ammonium polyacrylate) in the above example, one may substitute a polyacrylic acid, such as Acrysol A-5 (Rohm and Haas). In this case, it is preferred to dilute the Acrysol A-5 to 5-weight-percent solution and to raise the pH to about 5.0 with ammonium hydroxide before adding to the precoating emulsion.

The precoating composition of the example may vary considerably, but is preferred in the following ranges:

| Opacifier E-305 | 4 to 12 | percent |
| --- | --- | --- |
| Rhoplex AC-73 | 1 to 2 | percent |
| Acrysol G-110 | 0.06 to 0.12 | percent |

Referring to FIG. 1, the inner surface 23 of a glass 25V faceplate panel 21 for a color television picture tube is thoroughly cleaned. Then, the precoating composition is applied to the clean glass surface. The precoating composition may be applied to the glass surface by any coating method but is preferably applied as a limp stream 25 in the manner described in U.S. Pat. No. 3,652,323 to B. K. Smith. Preferably, the panel rotates at about 30 rpm about an axis 27 that is inclined from vertical 29 by about 80°. After the emulsion is applied, the rotation of the panel 21 is briefly increased to about 100 rpm to remove the excess emulsion, and then infrared heat is applied to dry the precoating. The precoating and panel may reach a temperature of about 55°C during the drying step, if the precoating is dried rapidly with high applied heat. The precoatng may be dried more slowly near room temperature (about 20° to 25°C). Often the precoating is set more firmly and is less dispersible to water if it is dried at the higher temperatures.

Next, the coating composition is applied to the precoated surface 21. The coating composition comprises a mixture of phosphor particles, a photobinder, a photosensitizer for the binder and water, as is known in the art. One suitable coating composition contains, in about the following proportions, 292 grams green-emitting, copper-activated zinc-cadmium sulfide particles, 233 grams of a ten-weight percent aqueous solution of polyvinyl alcohol having an average molecular weight of about 170,000 to 220,000, 13 grams of a 45-weight-percent aqueous solution of an acrylic copolymer, 14 grams of a ten-weight-percent aqueous solution of ammonium dichromate and about 402 grams of deionized water. The coating composition is thoroughly mixed and the viscosity of the mixture is adjusted to be in the range of about 20 to 50 centipoises. The pH is adjusted to about 6.4. The coating composition is then flow-coated upon the inner surface of the precoated faceplate and dried to produce a dry coating containing about 4.5 mg/cm$^2$ of phosphor particles.

Figure 2:
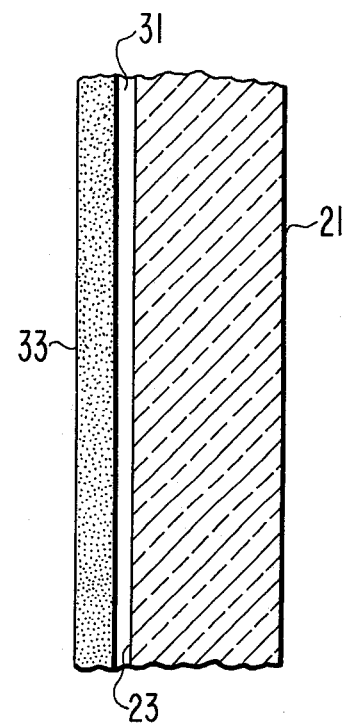
FIG. 2 is a fragmentary sectional view of a glass faceplate panel carrying a precoating and a phosphor-photobinder coating prepared by the novel method.

FIG. 2 shows a fragment of the panel 21 carrying a precoating 31 on the inner surface 23 thereof and phosphor-photobinder coating 33 on the precoating 31. The apertured mask of the faceplate is then inserted on the studs 35 (FIG. 1) provided therefor and the faceplate assembly positioned upon a lighthouse platform. Ultraviolet light from a small area light source in the lighthouse is projected through the mask, which permits a pattern of light to fall incident upon and expose the coating for about 6 minutes. The faceplate panel is then removed from the lighthouse and the mask removed from the faceplate panel. The exposed coating is developed by subjecting the coating to a turbulent quantity of aqueous liquid, as by spraying and flushing with water or an aqueous developing solution to remove the unexposed and substantially unexposed portions of the coating while retaining the exposed and substantially insoluble portions of the coating in place.

The novel method may be used to print any particle pattern (pattern of particulate material) upon any glass supporting surface. The particles of the coating may be luminescent or nonluminescent, may be light absorbing and may be any body color in reflected light. The novel method may be used particularly to print viewing-screen structures for cathode-ray tubes. Dot and line viewing-screen structures are examples. Where the particles of the coating are luminescent, they may emit in any portion of the spectrum as the result of any form of excitation.

The example illustrates the use of the novel method to produce a screen structure (the green-emitting field) for a color television picture tube by the slurry-direct photographic process. Many suitable coating compositions for the novel method applied to the slurry process are described in U.S. Pat. No. 3,269,838 to T. A. Saulnier, Jr. Generally, the coating composition is comprised of a water-soluble binder which is cross-linkable into insoluble form by actinic radiation in the presence of hexavelent chromium ions, a soluble dichromate photosensitizer for the binder, and particles of the pattern material. The binder may be any organic colloid, such as gelatin or fish glue, but is preferably a polyvinyl alcohol having a molecular weight greater than about 120,000. The binder is capable of being rendered photosensitive, as by dichromate ions, particularly by hexavalent chromiun ions, so that actinic radiation can render the polymer insoluble. When the photosensitizer is a source of hexavalent chromium ions, the photosensitizer may be any soluble dichromate such as sodium dichromate, potassium dichromate, or ammonium dichromate. The photosensitizer may be present in amounts of about 2 to 20 weight percent of the weight of the photobinder present.

The coating is exposed to a pattern of actinic radiation. Any actinic radiation such as visible light rays, ultraviolet light rays, or cathode rays may be used. A significant quality of the exposure is that, although coating portions may be insolubilized by actinic radiation, nevertheless the insoluble coating portions may not adhere sufficiently to the supporting surface to remain in place through the development step.

Adherence of the coating may be evaluated in a quantitative manner by using the segment exposure method. By this method, segments of a coated glass panel are exposed through an apertured mask, for example, from 2 to 10 minutes in 1-minute increments over segments of the panel and then developed with water. After developing, the segments are examined to measure the phosphor-dot diameters microscopically and to determine the minimum exposure time where the dots just adhere or only a few dots are lost. The adherence number is defined as the ratio of the maximum exposure time to yield the required dot diameter to the minimum exposure time where the phosphor dots barely adhere; it being known that the longer the exposure, the larger the dot produced. In the above example, if the required dot diameters are obtained on the 8-minute segment and dots are lost below 5 minutes exposure, then the adherence number is 8/5 or 1.6. A coating is more desirable where the adherence number is the greater.

Figure 3:
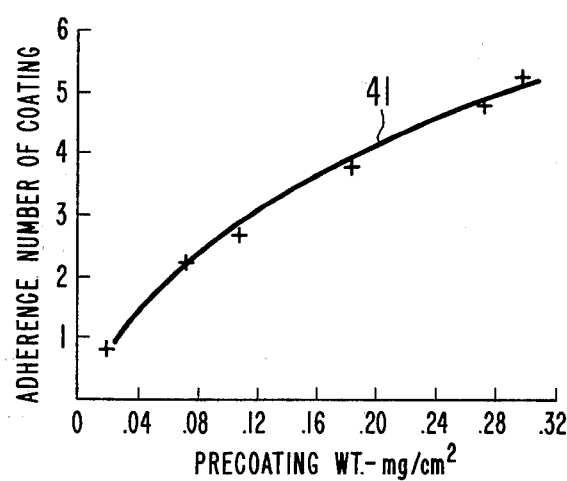
FIG. 3 is a graph plotting the adherence number (a figure of merit defined below) of the coating against the weight of the precoating for a particular series of experimental samples.

FIG. 3 shows a curve 41 which tabulates in graphic form the results of a series of tests illustrating the increase in adherence of the coating to the glass support through various thicknesses or weights of precoating prepared according to the example herein with a constant coating weight of 4.5 mg phosphor/cm$^2$, but varying the concentration of the polystyrene material in the precoating composition. In this series, a 2.0-weight-percent polystyrene emulsion produced an 0.08 mg/cm$^2$ precoating, and an 8.0-weight-percent polystyrene precoating produced an 0.28 mg/cm$^2$ precoating. The coating is also prepared according to the example. In this series, an adherence number below 2.5 is considered inadequate, between 2.5 and 3.5 the rating is good, and over 3.5 the rating is excellent. It has been found that if acrylic polymeric material (Rhoplex AC-73 or C72) is omitted from the composition, the adherence number will be higher at the equivalent precoating weight. However, under many screening conditions, omitting the acrylic results in inadequate "cleanup" as pointed out above. Under the conditions of the series shown in FIG. 3, a commonly used, very thin polyvinyl alcohol precoating has an adherence number of less than about 1.5.

What is claimed is:

1. A method for preparing a luminescent screen upon a glass surface comprising
    a. adhering to said glass surface a dry, non-photosensitive precoating consisting essentially of discreet water-insoluble, organic, polymeric particles, said precoating having a weight of about 0.08 to 0.80 milligrams per square centimeter,
    b. depositing upon said precoating a layer of a slurry comprising phosphor particles and a photosensitive binder therefor,
    c. exposing said coating to a light image whereby to form in said coating selected regions of greater solubility and selected regions of lesser solubility,
    d. and then developing said exposed coating by selectively removing said regions of greater solubility.
2. The method defined in claim 1 wherein step (a) includes
    i. applying to said glass surface of a coating of an aqueous emulsion comprising 5 to 15 weight percent of said water-insoluble organic, polymeric particles which are rendered nondispersible in water when dried and which are volatilized when baked in air at about 400°C, and
    ii. drying said coating.
3. The method defined in claim 2 wherein said coating is dried at temperatures below 55°C.
4. The method defined in claim 2 wherein said polymeric particles consist essentially of polystyrene copolymer and are about 0.10 to 0.35 micron in average diameter.
5. The method defined in claim 2 wherein said emulsion includes up to 5 weight percent of water-insoluble particles of acrylic polymeric material.
6. A method for preparing a luminescent screen upon a glass surface comprising
    a. applying to said glass surface a layer of an aqueous emulsion containing 5 to 15 weight percent of a water-insoluble polystyrene,
    b. drying said emulsion layer to produce a dry, non-photosensitive precoating consisting essentially of discrete water-insoluble polymeric particles adhered to said glass surface, said precoating having a weight of about 0.08 to 0.80 milligrams per square centimeter,
    c. depositing on said precoating a layer of a slurry comprising phosphor particles, polyvinyl alcohol, and a photosensitizer therefor,
    d. drying said slurry layer to produce a coating on said precoating,
    e. exposing said coating to a light image to produce selected regions of greater solubility and selected regions of lesser solubility in said coating,
    f. and then developing said coating by applying thereto a turbulent quantity of aqueous liquid to selectively remove said regions of greater solubility.
7. The method defined in claim 6 wherein precoating weight is in the range of about 0.20 to 0.40 milligrams per square centimeter.
8. The method defined in claim 6 wherein said emulsion includes a proportion of water-insoluble acrylic copolymer up to about 36 weight percent of the polystyrene particles present.
9. The method defined in claim 6 wherein said coating has a weight of about 4 to 6 milligrams phosphor per square centimeter.
10. The method defined in claim 6 wherein said developing step includes applying a pressure spray of aqueous developing liquid to said exposed coating.

* * * * *

UNITED STATES PATENT OFFICE
CERTIFICATE OF CORRECTION

PATENT NO. : 3,966,474
DATED : June 29, 1976
INVENTOR(S) : Stanley Arthur Harper It is certified that error appears in the above-identified patent and that said Letters Patent are hereby corrected as shown below:

Column 2, line 39    change "elevated" to --elevational--

Column 5, line 52    after "and" insert --a--

Column 6, line 21    change "hexavelent" to --hexavalent--

Column 7, line 25    change "discreet" to --discrete--

Column 7, line 31    after "therefor," insert --and drying said slurry layer to produce a coating on said precoating,--

Column 7, line 39    first occurrence delete "of"

Signed and Sealed this

Twenty-first Day of September 1976

[SEAL]

Attest:

RUTH C. MASON
Attesting Officer

C. MARSHALL DANN
Commissioner of Patents and Trademarks